(12) United States Patent
Schreiber et al.

(10) Patent No.: US 9,963,773 B2
(45) Date of Patent: May 8, 2018

(54) DURABLE MGO—MGF2 COMPOSITE FILM FOR INFRARED ANTI-REFLECTION COATINGS

(71) Applicant: Corning Incorporated, Corning, NY (US)

(72) Inventors: Horst Schreiber, Livonia, NY (US); Jue Wang, Fairport, NY (US); Scott J Wilkinson, Shrewsbury, MA (US)

(73) Assignee: Corning Incorporated, Corning, NY (US)

( * ) Notice: Subject to any disclaimer, the term of this patent is extended or adjusted under 35 U.S.C. 154(b) by 0 days. days.

(21) Appl. No.: 15/450,647

(22) Filed: Mar. 6, 2017

(65) Prior Publication Data

US 2017/0175245 A1    Jun. 22, 2017

Related U.S. Application Data

(62) Division of application No. 13/475,009, filed on May 18, 2012.
(Continued)

(51) Int. Cl.
*C23C 14/00* (2006.01)
*G02B 1/113* (2015.01)
(Continued)

(52) U.S. Cl.
CPC ........ *C23C 14/0031* (2013.01); *C23C 14/042* (2013.01); *C23C 14/0694* (2013.01);
(Continued)

(58) Field of Classification Search
CPC ... C23C 14/00–14/088; C23C 14/10–14/5893; G02B 1/10–1/118
See application file for complete search history.

(56) References Cited

U.S. PATENT DOCUMENTS

| | | | |
|---|---|---|---|
| 4,057,316 | A | 11/1977 | Hacman et al. |
| 4,264,133 | A | 4/1981 | Sakurai |

(Continued)

FOREIGN PATENT DOCUMENTS

| | | |
|---|---|---|
| JP | 1994-313802 | 11/1994 |
| JP | 1996114701 A | 5/1996 |

(Continued)

OTHER PUBLICATIONS

English Translation of JP2017001061 Office Action Dated Sep. 26, 2017, Japan Patent Office.
(Continued)

*Primary Examiner* — Bumsuk Won
*Assistant Examiner* — Jeffrey Madonna
(74) *Attorney, Agent, or Firm* — Kevin L. Bray

(57) ABSTRACT

This disclosure is directed to an optic having a composited MgO—MgF$_2$ infrared anti-reflective coating that is suitable for use in LWIR, MWIR and SWIR ranges, and is particularly suitable for use in the LWIR range. The coated optic disclosed herein passes the severe abrasion test with a barring force between 2 pounds and 2.5 pounds. The MgO—MgF$_2$ infrared anti-reflective coating has a thickness in the range of 500 nm to 1500 nm and a reflectance value $R_x$ at 12° of less than 2% in the wavelength range of 7.25 nm to 11.75 nm.

3 Claims, 3 Drawing Sheets

Related U.S. Application Data

(60) Provisional application No. 61/491,667, filed on May 31, 2011.

(51) Int. Cl.

| | | |
|---|---|---|
| *C23C 14/08* | (2006.01) | |
| *C23C 14/06* | (2006.01) | |
| *C23C 14/30* | (2006.01) | |
| *C23C 14/50* | (2006.01) | |
| *C23C 14/04* | (2006.01) | |

(52) U.S. Cl.
CPC ............ *C23C 14/081* (2013.01); *C23C 14/30* (2013.01); *C23C 14/505* (2013.01); *G02B 1/113* (2013.01)

(56) References Cited

U.S. PATENT DOCUMENTS

| | | | |
|---|---|---|---|
| 5,165,960 | A | 11/1992 | Platts |
| 6,458,253 | B2 * | 10/2002 | Ando .................. C23C 14/0057 204/192.12 |
| 6,821,616 | B1 * | 11/2004 | Sakurai ............... C03C 17/3452 428/332 |
| 8,382,823 | B2 * | 2/2013 | Kim .......................... A61F 2/91 623/1.44 |
| 9,017,525 | B2 * | 4/2015 | Akiba ................. C23C 14/0694 204/192.12 |
| 2001/0031543 | A1 | 10/2001 | Ando et al. |
| 2008/0050910 | A1 | 2/2008 | Hart et al. |
| 2008/0204862 | A1 | 8/2008 | Wang et al. |
| 2009/0141358 | A1 | 6/2009 | Cangemi et al. |
| 2009/0297812 | A1 | 12/2009 | Cangemi et al. |
| 2010/0215932 | A1 | 8/2010 | Schreiber et al. |
| 2011/0014398 | A1 * | 1/2011 | Yamamoto ............... B05D 1/60 427/569 |
| 2011/0111131 | A1 * | 5/2011 | Vergohl .................. B05D 1/60 427/523 |
| 2011/0267685 | A1 | 11/2011 | Schreiber et al. |
| 2014/0154510 | A1 * | 6/2014 | Odagawa ............... B82Y 10/00 428/408 |

FOREIGN PATENT DOCUMENTS

| | | |
|---|---|---|
| JP | 1996-310840 | 11/1996 |
| JP | 1998282304 A | 10/1998 |
| JP | 1999106899 A | 4/1999 |
| JP | 2001262317 A | 9/2001 |
| JP | 2003-322702 | 11/2003 |
| JP | 2005-281726 | 10/2005 |
| JP | 2006-065140 | 3/2006 |
| JP | 2010-501736 | 1/2010 |
| WO | 2009150855 | 12/2009 |

OTHER PUBLICATIONS

Wang et al; "Elastic and Plastic Relaxation of Densified SiO2 Films"; Applied Optics, vol. 47, No. 13, 2008 C131-C134.
Wang et al; "Extended Lifetime of Fluoride Optics"; Proc. of SPIE vol. 6720; 67200I-1-67200I-9.
Wang et al; "Optical Coatings With Ultralow Refractive Index SiO2 Films"; Proc. of SPIE, vol. 7504, 75040F-1-75040F-9.
Handbook of Chemistry and Physics, 48th Ed. (The Chemical Rubber Co., Cleveland, OH, 1968) p. B-192.
Patent Abstract translation of JP2003-322702.
Patent Abstract translation of JP2006-065140.
PCT/US2012/039230 Search Report dated Sep. 10, 2012.

* cited by examiner

DURABLE MGO—MGF2 COMPOSITE FILM FOR INFRARED ANTI-REFLECTION COATINGS

This application is a divisional and claims the benefit of priority under 35 U.S.C. § 120 of U.S. application Ser. No. 13/475,009, filed on May 18, 2012, which claims the benefit of priority under 35 U.S.C. § 119 of U.S. Provisional Application Ser. No. 61/491,667 filed on May 31, 2011, the contents of which are relied upon and incorporated herein by reference in their entirety.

BACKGROUND

The demands of aerospace and defense has been one of the main driving forces for fast development of infrared (IR) optics, in particular for infrared optics that will operate in a short-wave infrared range (SWIR) of 1-3 µm, a middle-wave infrared range (MWIR) 3-5 µm, and long-wave infrared range (LWIR) of 8-14 µm. The materials that can be used for the LWIR region are limited because the most frequently materials that are used are oxide materials and they are not transparent in the LWIR spectral regime. Germanium (Ge), zinc-selenide (ZnSe) and zinc-sulfide (ZnS) are the most popular optical window materials for use in the LWIR regime, these materials having a transmittance of 47%, 71% and 75%, respectively. An additional consideration of importance is that the IR optic made of the foregoing materials may be exposed to severe environmental condition for various applications. Consequently, environmentally durable antireflection (AR) coatings are necessary for LWIR optics applications.

The optical performance of an AR coating is dominated by the refractive index of outermost layer. A low refractive index of the outermost layer enables one to achieve a broadband AR coating. However, coating durability and environmental stability are mainly affected by the outermost layer in optical coatings. As a result, the material property of the outermost layer plays a critical role not only in optical performance, but also in mechanical strength and environmental stability. An IR-AR coating from 7.7µ to 10.3µ has been established where ytterbium fluoride (YbF3) is used as the outermost layer. There are IR-AR coatings in current use that pass the both the optical specification and a moderate abrasion test with a minimum bearing force of 1 pound. However, recently it has been indicated that a severe abrasion test will be required for future LWIR AR coated products. The existing AR coating, however, could not pass the severe abrasion test with a barring force between 2 and 2.5 lbs (MIL-C-48497A). Consequently, there is a need for a low refractive index coating material with durable mechanical property to ensure both a broadband antireflection spectral performance and to withstand the severe abrasion test. At the present time there are no optical AR coatings that give satisfactory performance, transmission, including abrasion resistance, in all of (1) a short-wave infrared range (SWIR) of 1-3 µm, (2) a middle-wave infrared range (MWIR) 3-5 µm, and (3) a long-wave infrared range (LWIR) of 8-14 µm.

SUMMARY

The present disclosure is directed to the formation an optic having a smooth, dense uniform composited MgO—$MgF_2$ coating and a method of forming such composited coating from a $MgF_2$ source material by vaporization of the $MgF_2$ material and fluorine depletion on an oxygen-containing plasma atmosphere that further densifies and smoothes the composited MgO—$MgF_2$ coating. The disclosure is further directed to a low refractive index coating material with durable mechanical properties that provides a broadband antireflection spectral performance in the range of 1-14 µm and can withstand a severe abrasion test. For a selected IR range, for example, SWIR, MWIR or LWIR, the thickness of the coating is dependent on the range in which it will be used. Thus the thickest coatings will be used in the LWIR range, the thinnest coatings will be used in the SWIR range, and coatings of intermediate thickness will be used in the MWIR range. The composited MgO—$MgF_2$ coating described herein can be used in all three ranges. The broad range for the deposited coating is 100 nm to 1500 nm. In an embodiment for the LWIR range the coating thickness is in the range of 600 nm to 900 nm. In an embodiment for the MWIR range the thickness is in the range of 250 nm to 450 nm. In an embodiment for the SWIR range the thickness is in the range of 150 nm to 300 nm.

While $MgF_2$, one of the hardest metal fluoride materials, seems to be a good candidate as low refractive index capping layer because of its transparency up to the LWIR, it has one detriment. It is known that a relative thicker layer is required in the LWIR spectral regime as compared to the VIS and UV spectral regimes. In fact, an $MgF_2$ AR coating must be up to 40 times thicker in the LWIR range than an $MgF_2$ coating in the UV range. However, $MgF_2$ film porosity and surface roughness rise significantly as layer thickness increases, and this in turn reduces the corresponding film durability for LWIR application. The present disclosure solves this problem through the use of modified plasma ion-assisted deposition with in-situ plasma smoothing to provide a technical solution by the production of a chemically and mechanically strengthened the MgO—$MgF_2$ composited coating.

It is shown herein that the goal of durable MgO—$MgF_{22}$ composited film for infrared AR coatings can be achieved using the following steps:

1. Formation of a MgO—$MgF_2$ composited film by plasma ion-depleting fluorine and replacing the fluorine with oxygen.
2. Densification of MgO—$MgF_2$ composited film using modified PIAD (plasma ion-assisted deposition) with a reversed mask technique.
3. Optimization of optical and mechanical properties of MgO—$MgF_2$ composited film by adjusting the ratio of in-situ plasma smooth and plasma assisted deposition The result is a smooth and densified MgO—$MgF_2$ composited coating layer that provides for the increased durability of a broadband IR-AR composited MgO—$MgF_2$ coating that can be used in each of the SWIR. MWIR and LWIR range described herein.

DETAILED DESCRIPTION

Figure 1:
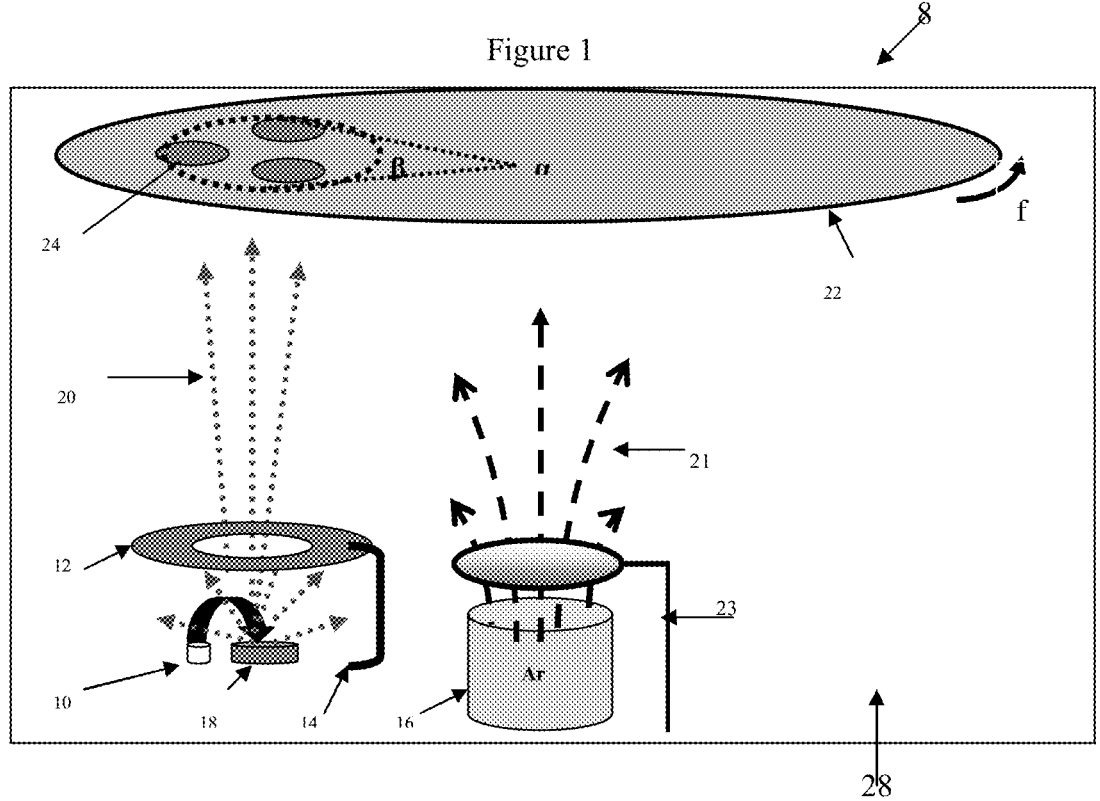
FIG. 1 is a schematic drawing of modified PIAD deposition system in an oxygen rich plasma environment using a reversed mask and a side shield that enable the deposition of a thick, densified and smooth MgO—$MgF_2$ composited coating.

Herein the term "composited film" or "composited coating" means a MgO—MgF$_2$ film or coating in which MgF$_2$ is used as the bulk material, and as it is vaporized and deposited on a substrate using PIAD and an oxygen rich atmosphere as described herein, and fluorine depletion and replacement occurs with the formation of a MgO—MgF$_2$ coating that is densified and smoothed by the plasma ion assist. The resulting film is one in which a Mg atom may be bonded to both a F atom and an O atom resulting is a uniform film and not one in which the MgO merely fills voids or the porosity of a MgF$_2$ structure. In a composited coating the porosity of the base metal fluoride material is filled-in and the coating is densified as it is being deposited, hence thicker, more a durable coating can be made. In the earlier coatings the oxide is applied as a separate layer after the metal fluoride layer is formed and it also filled the porosity or any columnar structure of the metal fluoride film. Further, in previous applications the coating structure was for use with UV radiation. Such structures cannot be used in the infrared, particularly the LWIR. Also herein the terms "film" and "coating" may be used interchangeably. Further the coatings described herein are directed to operations in a short-wave infrared range (SWIR) of 1-3 μm, a middle-wave infrared range (MWIR) 3-5 μm, and long-wave infrared range (LWIR) of 8-14 μm.

It is known that optical performance of an AR coating is dominated by the refractive index of outermost layer. A low refractive index of the outermost layer enables one to achieve a broadband AR coating [Jue Wang et al, "*Optical coatings with ultralow refractive index SiO$_2$ films*," 41$^{st}$ Boulder Damage Symposium, Sep. 21-23, 2009, SPIE 7504, 75040F]. On the other hand, coating durability and environmental stability are mainly affected by the outermost layer in optical coatings. As a result, material property of the outermost layer plays a critical role not only in optical performance but also in mechanical strength and environmental stability. As one of the hardest fluoride materials, MgF$_2$ is a good candidate as a low refractive index layer for optical coating applications from UV, VIS up to LWIR. However, the MgF$_2$ film or coating thickness for AR coatings in the LWIR range needs to be 40 times thicker than that used for MgF$_2$ coatings AR coatings in the UV range. Further, the MgF$_2$ film porosity and surface roughness strongly correlate to the layer thickness. Thick MgF$_2$ layers lead to a porous, very rough surface which in turn results in a low abrasion resistance. A MgO—MgF2 composited film suitable for use in the LWIR range and providing enhanced durability was prepared the use of modified PIAD with a high bias voltage and an oxygen rich plasma environment.

Modified plasma ion-assisted deposition (PIAD) has been established for oxide coatings such as SiO$_2$ have been described in US Patent Application Publication Nos. 2010/ 02154932 and 2009/0141358. The modified PIAD technique enables the preparation of dense and smooth oxide coatings. However, for hybrid oxide-fluoride coatings such as used in DUV coatings the method has been to deposit a metal fluoride layer and then fill in and smooth the fluoride layer indirectly by inserting in-situ smoothed oxide layers between metal fluoride layers. In contrast to the DUV coatings, in the present disclosure the plasma ions were directly employed to modified MgF$_2$ film within a reversed mask configuration, see US application publication 2008/ 0050910, and an oxygen-rich environment, leading to a formation of MgO—MgF$_2$ composited film. The strengthened MgO—MgF2 composited film was used as a capping layer for a LWIR broadband AR coating and the MgO—MgF$_2$ capping layer resulted on in increased abrasion resistance and environmental durability.

FIG. 1 is a schematic drawing of modified PIAD with a reverse mask and a side shield that enabled the deposition of thick MgO—MgF2 composited films or coatings that are also simultaneously densified. FIG. 1 illustrates a deposition set-up 8 having a vacuum chamber 28 in which is located a substrate carrier 21 having substrates 24 thereon, an e-beam 10 that impinges a target 18 to produce a vapor flux 20 that passes through a reversed mask 12 for deposition on the substrates 24. In addition, there is a plasma source 15 that generates a plasma 21, for example an argon plasma, and a oxygen source/feed for producing the plasma as a an oxygen containing plasma.

The film densification process is controlled by means of masking technology as shown in FIG. 1, where zone α and β correspond to the mask shadowed and un-shadowed areas, respectively. This process is described by Eq. (1), $$P = P_\alpha + P_\beta = \frac{1}{2\pi}\left(\frac{\alpha}{n_s f} + \frac{\beta}{R}\kappa\right)J_i\sqrt{2m_i eV_b} \qquad (1)$$

where $P_\alpha$ represents in-situ plasma smoothing, $P_\beta$ corresponds to plasma ion-assisted deposition. $V_b$ is the bias voltage, $J_i$ and $m_i$ are the plasma ion flux in ion/(cm$^2$ sec) and $m_i$ is mass in a.u., respectively. R is the coating deposition rate in nm/sec; e is the electron charge; κ is a unit conversion factor; $n_s$ is surface atom density in atom/cm$^2$; and α and β are the radian of mask shadowed and un-shadowed area of the vapor flux relative to the center of the rotated plate having a rotation frequency of f. Adjustment of the mask shape and height, APS parameters, and plate rotation frequency enables one to separately control the amount of momentum transfer for fluorine depletion and for plasma assisted deposition. Oxygen gas, O$_2$, is introduced into the deposition system during the modified PIAD process to compensate fluorine loss and obtain MgO—MgF2 composited film. In the deposition processes described herein the process parameters that were used are Vb=110 V, α/β=2/1, O$_2$ flow rate=6 sccm, Ar flow rate=11 sccm, R=0.25 nm/sec, f=0.4 Hz, and substrate temperature=120° C., where sccm is standard cubic centimeters per minute. The oxygen flow rate is proportional to the deposition rate and the applied bias voltage, and can range from 3 sccm to 25 sccm depending on the deposition rate and bias voltage. It should be noted that in the process described herein a relatively high bias voltage of 110V was employed in the process. In contrast to the present condition, in the deposition of a PIAD MgF$_2$ film for DUV applications a low bias voltage of approximately 50V is necessary in order to eliminate the amount of fluorine depletion. In the present disclosure, in which a composited MgF$_2$—MgO coating is formed by fluorine depletion of the MgF$_2$ source material and replacement with oxygen, a high bias voltage is intentionally applied for MgF$_2$ film modification in an oxygen rich plasma environment in order to form the MgO—MgF$_2$ coating. There are three attributes which lead to an enhanced abrasion resistance of the MgO—MgF2 composited film prepared via the modified PIAD process, modified film composition, increased film packing density and smoothed film surface.

(a) Modified Film Composition and Increased Film Packing Density

Based on Eq.(1), the amount of plasma momentum transfer P$_\beta$ applied for film deposition is defined by, $$P_\beta = \left(\frac{\beta}{2\pi R}\kappa\right) J_i \sqrt{2m_i eV_b} \quad (2)$$

Figure 2:
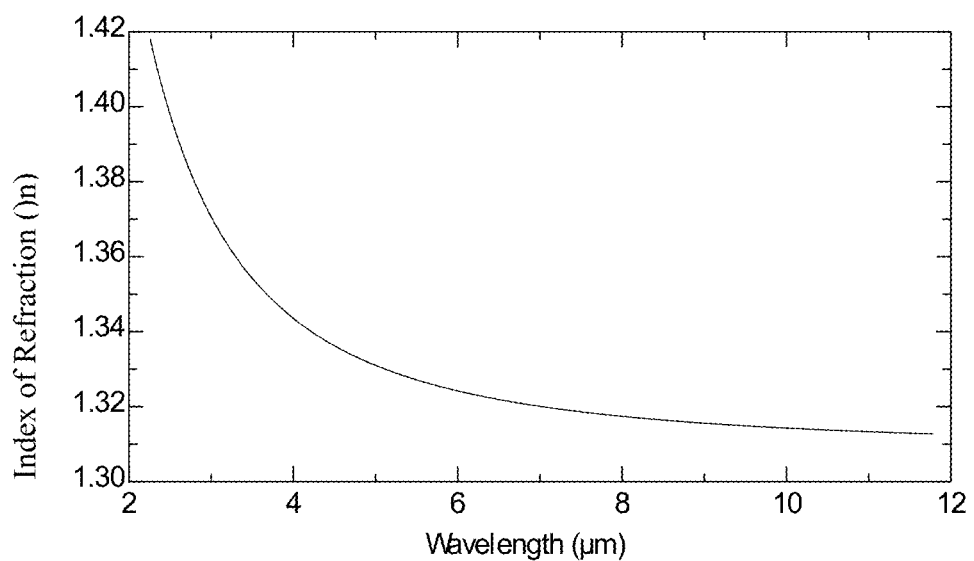
FIG. 2 is a graph of the refractive index versus wavelength in the infrared spectral range of the modified MgO—MgF2 composited coating that was obtained using the modified PIAD method.

It has been understood that the refractive index of PIAD modified film, in which the plasma ion-assist densifies and smoothes the coating, is directly correlated to film packing density and film composition. FIG. 2 is a graph of the refractive indices, n, of a 200 nm modified MgO—MgF$_2$ coating as a function of wavelength. A comparison of the refractive index at a wavelength of 2 μm, where most reference data is available, can be made for the modified MgO—MgF$_2$ coating versus bulk MgF$_2$ and MgO. The estimated refractive index of the modified a MgO—MgF$_2$ film disclosed herein is 1.43. The refractive index of MgF$_2$ and MgO bulk materials at the same wavelength is 1.37 and 1.73, respectively (Handbook of Chemistry and Physics, 48$^{th}$ ed. (The Chemical Rubber Co., Cleveland, Ohio, 1968) page B-192). To explain the relatively high refractive index of the modified MgO—MgF$_2$ film, there is a need to consider impact of film densification process in an oxygen rich plasma environment.

Looking first at the composition, fluorine depletion typically occurs when plasma interacts with the fluorides (see J. Wang et al, Extended lifetime of fluoride optics," 39$^{th}$ Bolder Damage Symposium, published as Proceedings of the SPIE 6720, 672011-9 (2009). The amount of fluorine depletion is strongly process dependent. Using a bias voltage of 110 V and a deposition rate of 0.25 nm/sec, it is reasonable to assume a maximum of 10% fluorine is depleted during the MgF$_2$ modification process which results in the formation of a MgO—MgF$_2$ coating. Within an oxygen rich plasma environment, the depleted fluorine sites are replaced by oxygen, leading to the formation of MgO and resulting in a MgO—MgF$_2$ composited coating. An estimated refractive index of coating consisting of 10% MgO and 90% MgF$_2$, the material being deposited using MgO and MgF$_2$ as coating source materials, at a wavelength of 2μ is 1.40, which is lower the value of 1.43 for the modified MgO—MgF$_2$ film of the present disclosure in which only MgF$_2$ is the only metal-containing source material and oxygen is used to convert some of the MgF$_2$ to MgO. The additional increase in refractive index of the modified MgF$_2$ film may contribute to the fact that the PIAD process results in a high film packing density which is higher than the MgF$_2$ bulk material. Similar densification effect has been obtained in SiO$_2$ film (J. Wang et al, "Elastic and plastic relaxation of densified SiO$_2$ films," Applied Optics Vol. 47(13), pages 189-192 (2008)). In the present disclosure, where oxygen is used in the PIAD process, the modified MgF$_2$ film or coating is a densified to form a MgO—MgF$_2$ composited coating or film, instead of a pure MgF$_2$ film or coating.

(b) Smoothed Film Surface

In addition to high film packing density and modified film composition as discussed above, it is also important to realize that a smooth film surface enhances film durability. The plasma momentum transfer P$_\alpha$ used for plasma smoothing can be determined by, $$P_\alpha = \left(\frac{\alpha}{2\pi n_s f}\right) J_i \sqrt{2m_i eV_b} \quad (3)$$

where n$_s$ in Eq.(3) is the surface atom density of the deposited film in atom/cm$^2$. All other parameters are described in Eq.(1). This process is called in-situ plasma smoothing because the plasma successively interacts with the deposited film surface of every 3~4 atomic layer.

Figure 3A:
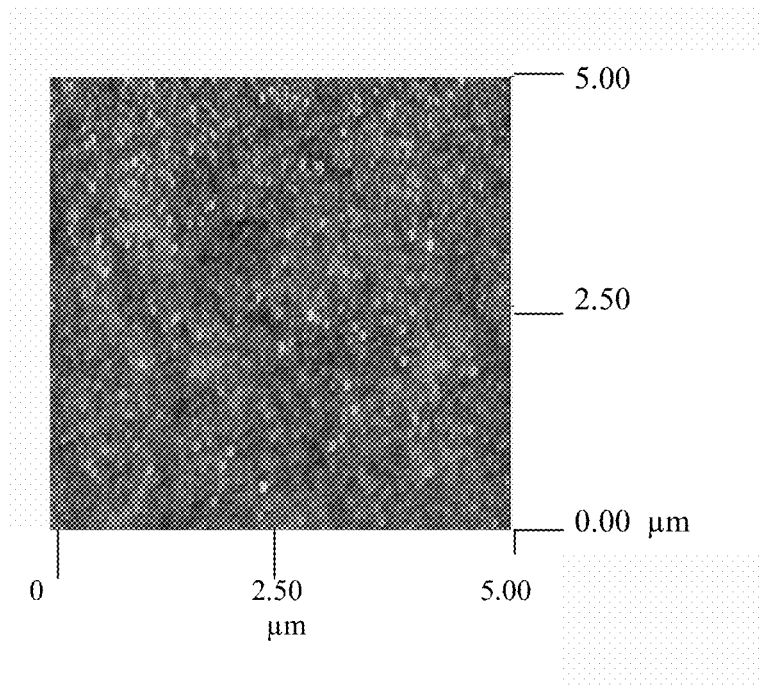
FIGS. 3a and 3b are AFM images of 200 nm MgO—MgF2 composited film deposited by the modified PIAD process (3a) and a standard 200 nm MgF2 film (3b) that was deposited without using the modified PIAD technique. The films corresponding surface roughness is 0.4 nm of FIG. 3a and 2.4 nm for FIG. 3b.
Figure 3B:
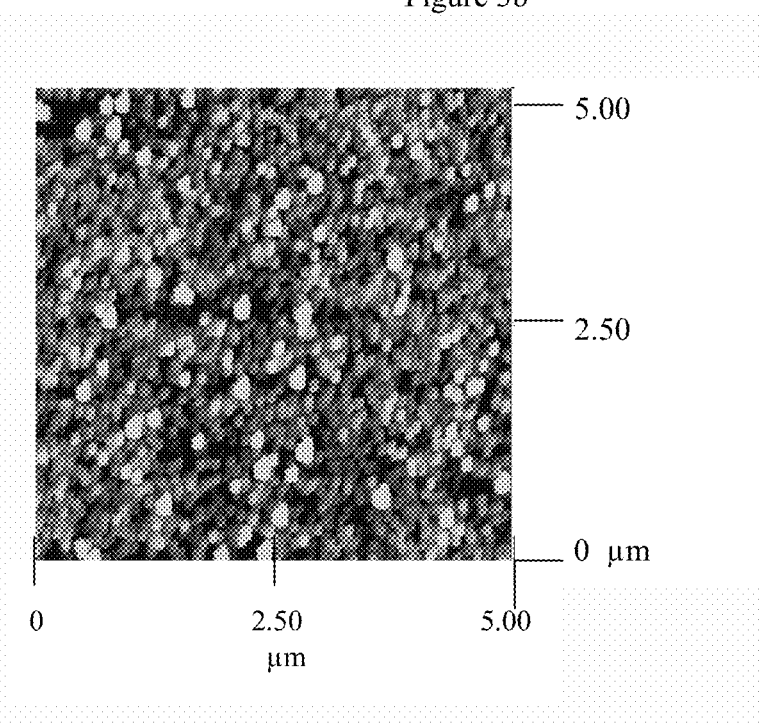

The plasma smoothing effect can be demonstrated by comparing surface features of the modified MgO—MgF$_2$ composited film with a standard pure MgF$_2$ film derived by PVD. FIGS. 3a and 3b show AFM images of 200 nm MgO—MgF$_2$ composited film deposited by the modified PIAD process (FIG. 3a) and a standard pure MgF$_2$ film with the same thickness (FIG. 3b). The corresponding surface roughness for FIGS. 3a and 3b is 0.4 nm and 2.4 nm, respectively. The smoothed film structure of FIG. 3a further increases coating durability, especially when it is used as a capping layer.

(c) MgO—MgF2 Composited Film as Capping Layer for Durable IR AR Coating

Figure 4:
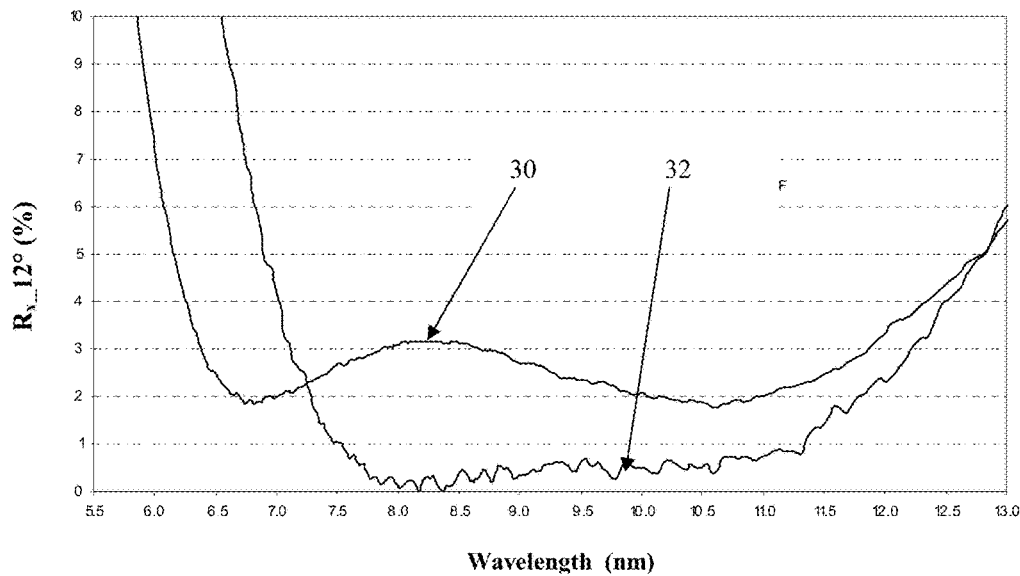
FIG. 4 is a graph of the reflectance (Rx) at 12° deg angle of incidence of a LWIR broadband AR coating without the MgO—MgF2 composited capping layer as shown by numeral 30 and with the MgO—MgF2 composited capping layer as shown by numeral 32.

There are many possible applications of the modified MgO—MgF$_2$ composited film for IR optics, especially for IR antireflective coatings where the modified MgO—MgF$_2$ composited film serves as a capping layer, leading to an increased abrasion resistance and environmental durability. For example, the MgO—MgF$_2$ composited film can be used as a capping layer for a LWIR broadband AR application. FIG. 4 plots a reflectance (Rx) at 12° angle of incidence of a LWIR broadband AR coating without the MgO—MgF$_2$ composited capping layer (numeral 30); and with the MgO—MgF2 composited capping coating layer (numeral 32). The reflectance of the an optic having the MgO—MgF$_2$ composited capping coating layer is less than 2% in the wavelength range of 7.25 nm to 11.75 nm as shown in FIG. 4. In the wavelength range of 7.5 nm to 11.5 nm the reflectance Rx is less than 1%. In contrast, the reflectance of a coating without the MgO—MgF$_2$ composited capping coating layer is greater than 2% in the same wavelength.

Figure 5:
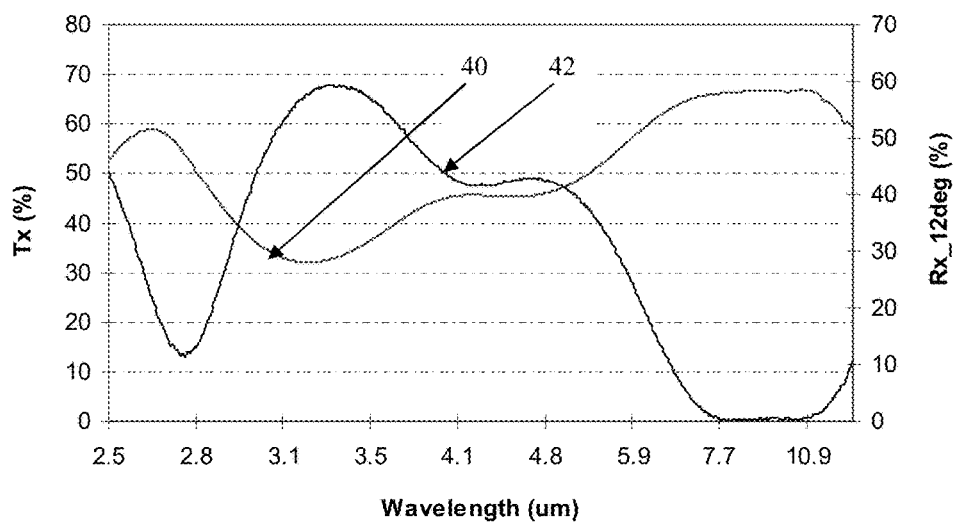
FIG. 5 is a graph illustrating spectral transmittance (Tx) represented by numeral 44 and reflectance (Rx 12°) represented by numeral 46 of the LWIR broadband AR coating with a MgO—MgF2 composited capping layer.

FIG. 5 plots the spectral transmittance Tx (numeral 40) and reflectance Rx_12° (numeral 42) of the LWIR broadband AR coating with the MgO—MgF$_2$ composited layer 30 as a capping layer. The reflectance Rx is less than 2% in the approximate range of 7.25 nm to 11.25 nm, and the transmission Tx is greater than 60% in the same wavelength range. The LWIR broadband AR without the capping layer fails severe abrasion test describe elsewhere herein. The durability of the MgO—MgF$_2$ composited AR coating increases with the use of a 700 nm MgO—MgF$_2$ composited capping layer. A witness sample prepared as described here with a 700 nm MgO—MgF$_2$ composited capping layer passed all severe abrasion tests and environmental tests using MIL-C-48497A.

Thus, the disclosure is directed to an optic having a composited MgO—MgF$_2$ anti-reflective coating thereon suitable for use with infrared radiation having a wavelength in the range of 1 μm to 14 μm, said coating thickness being variable with said wavelength range, the coating thickness being in the range of 100 nm to 1500 nm. In an embodiment suitable for the 1-3 µm infrared wavelength range the coating thickness is in the range of 150 nm to 300 nm. In an embodiment suitable for the 3-5 µm infrared wavelength range the coating thickness is in the range of 250 nm to 450 nm. In an embodiment suitable for the 8-13 µm infrared wavelength range the coating thickness is in the range of 600 nm to 1500 nm. In an embodiment the coating has a reflectance Rx of less than 2% in the wavelength range of 7.25 nm to 11.75 nm. In another embodiment the coating has a reflectance of less than 1% in the wavelength range of 7.5 nm to 11.5 nm. In a further embodiment the coated optic has a transmission of greater than 60% in the wavelength range of 7.5 nm to 11.5 nm. In an additional embodiment the coating on the coated optic passes an abrasion test with a barring force between 2 and 2.5 lbs.

The disclosure is further directed to a method of depositing a thin film of a selected material on the surface of a substrate using plasma ion assisted deposition, the method having the steps of:

providing a vacuum chamber and within said chamber:

providing a substrate on which a coating is to be deposited;

providing at a $MgF_2$ material source and vaporizing said material using an e-beam to provide a coating material vapor flux, said flux passing from said material source through a reversed mask to said substrate;

providing plasma ions contain oxygen ion within said plasma from a plasma source;

rotating said substrate at a selected rotation frequency f; and depositing said coating material on said substrate as a coating film and bombarding said substrate and said film with said plasma ions before and during said material depositions;

wherein the method forms a smooth, dense uniform composited $MgO$—$MgF_2$ coating.

In the method the coating is deposited to a thickness in the range of 100 nm to 1500 nm. For use in the 1-3 µm wave range the coating is deposited to a thickness in the range of 150 nm to 300 nm. For use in the 3-5 µm wavelength range the coating is deposited to a thickness in the range of 250 nm to 450 nm. For use in the 8-13 µm wavelength range the coating is deposited to a thickness in the range of 600 nm to 1500 nm.

We claim:

1. A method of depositing a thin film of a selected material on the surface of a substrate using plasma ion assisted deposition, the method having the steps of:

providing a vacuum chamber and within said chamber:

providing a substrate on which a coating is to be deposited;

providing at a $MgF_2$ material source and vaporizing said material using an e-beam to provide a coating material vapor flux, said flux passing from said material source through a reversed mask to said substrate;

providing plasma ions containing oxygen ions within said plasma from a plasma source;

rotating said substrate at a selected rotation frequency f; and depositing said coating material on said substrate as a coating film and bombarding said substrate and said film with said plasma ions before and during said material depositions;

wherein the method forms a smooth, dense uniform composited $MgO$—$MgF_2$ coating.

2. The method according to claim 1, wherein the coating material deposited on said substrate passes an abrasion test with a barring force between 2 lbs and 2.5 lbs.

3. The method according to claim 1, wherein the deposited coating has a thickness in the range of 100 nm to 1500 nm.

* * * * *

UNITED STATES PATENT AND TRADEMARK OFFICE
CERTIFICATE OF CORRECTION

PATENT NO. : 9,963,773 B2　　　　　　　　　　　　　　　　　　　　Page 1 of 1
APPLICATION NO. : 15/450647
DATED : May 8, 2018
INVENTOR(S) : Horst Schreiber et al.

It is certified that error appears in the above-identified patent and that said Letters Patent is hereby corrected as shown below:

On the Title Page

Item (54), Title, Line 1, and in the Specification, In Column 1, Line 1, delete "MGO-MGF2" and insert -- MGO-MGF$_2$ --, therefor.

Signed and Sealed this
Fourteenth Day of April, 2020

Andrei Iancu
*Director of the United States Patent and Trademark Office*